United States Patent [19]

Nishibuchi

[11] Patent Number: 5,028,475
[45] Date of Patent: Jul. 2, 1991

[54] LIGHOGRAPHIC FILM MATERIAL

[75] Inventor: Takehiko Nishibuchi, Osaka, Japan

[73] Assignee: Fuji Photo Film Co., Ltd., Kanagawa, Japan

[21] Appl. No.: 374,028

[22] Filed: Jun. 30, 1989

[30] Foreign Application Priority Data

Jun. 30, 1988 [JP] Japan .................................. 63-164477

[51] Int. Cl.⁵ ................................................ B32B 9/00
[52] U.S. Cl. ...................................... 428/195; 430/17; 430/306; 428/195
[58] Field of Search ................... 430/17, 306; 428/195, 428/336

[56] References Cited

U.S. PATENT DOCUMENTS 4,369,244  1/1983  Eian et al. ............................ 430/306
4,369,295  1/1983  Beruto et al. ........................ 430/306
4,467,022  8/1984  Eian et al. ............................. 430/17

Primary Examiner—Patrick J. Ryan
Attorney, Agent, or Firm—Sughrue, Mion, Zinn, Macpeak & Seas

[57] ABSTRACT

A lithographic film material is used to make an optical stencil with words formed by thermally removing an ink-layer by means of a thermal ink-transferred ribbon. The lithographic film material includes a transparent base sheet, a transparent thermoplastic interlayer coated over the transparent base sheet, and a light-opaque thermoplastic ink-layer coated over the thermoplastic transparent interlayer. The transparent thermoplastic interlayer as well as the light-opaque thermoplastic ink-layer are peeled in a letter pattern by an ink-transferred ribbon after being printed with a thermal print head of a thermal ink-transfer printer so as to form transparent letters on the transparent base sheet, thus providing the optical stencil.

8 Claims, 3 Drawing Sheets

LIGHOGRAPHIC FILM MATERIAL

BACKGROUND OF THE INVENTION

The present invention relates to a lithographic film material for making a lithographic negative film in the form of an optical stencil by the use of a thermal ink-transfer printer.

Mask plates, on which transparent words and/or illustrations are optically formed in stencil-like fashion (hereinafter referred to as optical stencils), are used to print words and/or illustrations on photographic prints. Such an optical stencil generally is made so that words are printed on photographic paper as a primary original with a photographic printer. The primary original then is copied or printed on a negative film material such as a lithographic film (hereinafter referred to simply as a lith film) to make a secondary original as an optical stencil. This procedure, which includes correcting and developing the primary and secondary originals, consumes time and takes much trouble, and further, requires special techniques.

In recent years, it has become popular to make an optical stencil by forming transparent words and/or illustrations on a lith film by a thermal ink-transfer printer. However, light-opaque layers of the conventional lith films are difficult to peel or remove when the transparent words and/or illustrations are printed with thermal ink-transfer printers now commercially available. Because the use of lith films requires a special peeling system for peeling off the light-opaque layer of the lith film printed by such a thermal ink-transfer printer, the optical stencil is neither economical nor technically advantageous.

Therefore, it is an object of the present invention to provide a novel lithographic film material from which a negative lithographic film can be made as an optical stencil with conventional thermal ink-transfer printers.

SUMMARY OF THE INVENTION

The above and other objects of the present invention are achieved by a lithographic film material comprising a transparent base sheet with a transparent thermoplastic interlayer and a lightopaque thermoplastic ink-layer overlaid or coated on the transparent base sheet in that order. The transparent thermoplastic interlayer has a melting point between 55° C. and 140° C., preferably between 75° C. and 120° C., and is removed or peeled effectively from the transparent base sheet when words and/or illustrations are printed on the light-opaque thermoplastic ink-layer by a commercially available thermal ink-transfer printer.

If the transparent thermoplastic interlayer has a melting point lower than about 55° C, it has a poor resistance to preservation, or if it has a melting point higher than about 140° C., it is hard or impossible to remove or peel off when words and/or illustrations are printed on the light-opaque thermoplastic ink-layer by a commercially available thermal ink-transfer printer. The molten thermoplastic interlayer has a viscosity lower than 2000cps, preferably lower than 800cps, when measured at a temperature 30° C. higher than a melting point at which the interlayer has melted. Furthermore, if the interlayer has a higher-than-2000cps viscosity, it is hard or impossible to remove or peel when words and/or illustrations are printed on the thermoplastic ink-layer by commercially available thermal ink-transfer printers.

If the lithographic film material has no interlayer, or if it has an interlayer made of materials other than thermoplastic materials, the light-opaque ink-layer overlaying the interlayer results in insufficient removal.

The light-opaque thermoplastic ink-layer contains 5 to 90 weight percent of at least one kind of thermoplastic resin, each kind having a softening point between 50° C. and 165° C. The suitable content of such a thermoplastic resin depends not only upon its softening point, melting point, coating strength and adhesivity, but also on properties of the other components of the light-opaque thermoplastic ink-layer. If the content of the thermoplastic resin is less than 5 weight percent, the light-opaque thermoplastic inklayer will have poor resistance to abrasion or an occurrence of blocking which causes trouble in handling and preserving the lithographic film. Otherwise, if the content of the thermoplastic resin is more than 90 weight percent, the light-opaque thermoplastic ink-layer is relatively hard to peel off, resulting in reduced sharpness of an image formed thereon.

The light-opaque thermoplastic ink-layer has a thickness between $0.5\mu m$ and $10\mu m$, and preferably between $3\mu m$ and $6\mu m$. If it is thinner than about $0.5\mu m$, it tends to get surface cracks and to have poor light shielding characteristics. On the other hand, if the light-opaque thermoplastic ink-layer is thicker than about $10\mu m$, it is liable to be hard to remove or peel off.

Main components of the thermoplastic interlayer are solid wax materials and thermoplastic resins. There are available, for the solid wax, various kinds of wax such as carnauba wax, montan wax, amid wax, polyethylene wax, candelilla wax, microcrystalline wax, oxidized wax, ester wax, paraffin wax, crude or haze wax, bees wax, and the like; and, for the thermoplastic resin, various kinds of resin such as acrylic resin, amide resin, ketonic resin, polystyrene resin, rosin resin, phenolic resin, terpene resin, ethylene vinyl acetate copolymer, vinyl chloride-vinyl acetate copolymer, cellulose resin, and the like.

Main components of the light-opaque thermoplastic ink-layer are light-opaque materials, solid wax materials and thermoplastic resins. For the light-opaque materials, many kinds of pigments or dyes generally are available, for example, organic pigments such as lake red, cuprous phthalocyanine and the like, inorganic pigments such as carbon black, prussian blue, titanium dioxide, calcium carbonate and the like, oil soluble dyes which are organic acid chlorides of basic dyes such as nigrosine base, methibi base and the like, metallic: powder such as aluminum powder, copper powder, zinc powder and the like. The solid wax may be of the same materials as for the thermoplastic interlayer. The thermoplastic resin may be of the same kinds of resin as for the thermoplastic interlayer, but has a softening point between 50° C. and 165° C. It is to be noted that the thermoplastic interlayer and the thermoplastic ink-layer, if desired, may contain oils and/or surface active agents. As an ink-layer peeling ribbon, it is desirable to use plastic films, such as a polyester film or a polycarbonate film, which generally is used as a base material of the conventional ink-transfer ribbons, thin condenser papers, thin glassine papers or the like, which may be either un-treated, matted, subjected to heat-resisting treatment, or treated with heat-sensitive adhesion.

DETAILED DESCRIPTION OF THE PREFERRED EMBODIMENT

Figure 1:
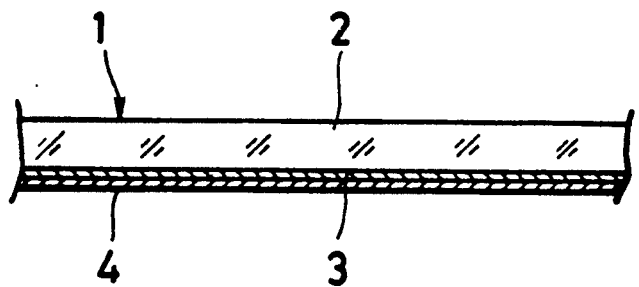
FIG. 1 is a fragmental cross-sectional view showing the structure of a lithographic film material in accordance with a preferred embodiment of the present invention.

Referring now to the drawings, in particular to FIG. 1, a lith film 1 in accordance with a preferred embodiment of the present invention is shown, consisting of a transparent base sheet 2, a transparent thermoplastic interlayer 3 which is attached to the transparent base sheet 2 and peelable or removable from the transparent base sheet 2, and a light-opaque thermoplastic inklayer 4. These layers 3 and 4 are made of thermoplastic materials and are coated over the transparent base sheet 2 in order in a well known manner such as hot-melt coating. The lith film 1 is used as an optical stencil by cutting it to a suitable size.

Figure 2:
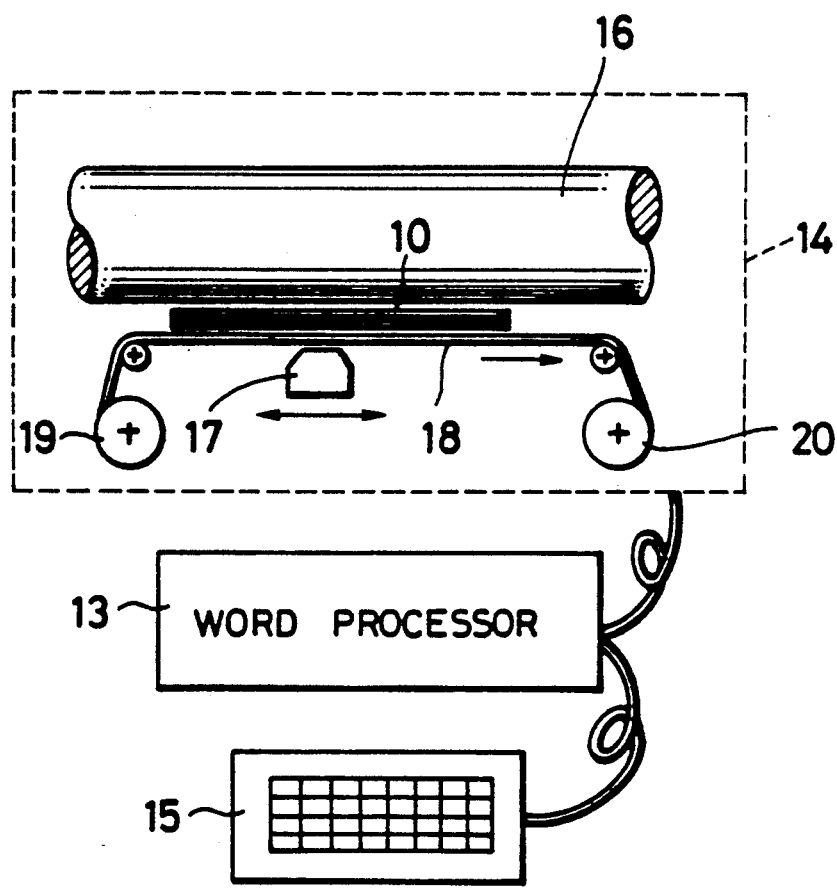
FIG. 2 is a diagrammatical illustration for explaining a method of an optical stencil.

Referring now to FIG. 2, to record an optical stencil 10 with a compliment or a message which consists of transparent words and illustrations with a dark background, a so called word-processor 13 or a personal computer which can be of any commercially available type is used. As shown, such a word-processor includes a thermal ink-transfer printer 14 and a keyboard unit 15. The optical stencil 10 is set on a platen roller 16 of the thermal inktransfer printer 14 so as to position the ink layer 4 outside. An ink absorption or ink-transferred or ink-layer peeling ribbon 18 travels between ribbon reels 19 and 20 passing between the platen roller 16 and a thermal print head 17.

A compliment or a message, including an illustration, edited by the word-processor 13 is printed on the lith film 1 put on the platen roller 16 by means of the thermal print head 17. That is, the thermal print head 17 generates heat according to a pattern of a letter and heats the lith film 1 through the ink-layer peeling ribbon 18 so as to melt the transparent thermoplastic interlayer 3 and the light-opaque thermoplastic ink-layer 4 in the letter pattern. The melted ink is absorbed by or transferred to the ink-layer peeling ribbon 18 and the transparent thermoplastic interlayer 3 is peeled off from the transparent base sheet 2 according to the letter pattern, thereby forming a transparent letter with a dark or black background on the lith film 1. In such a way, the thermal ink-transfer printer 14 prints a compliment or message consisting of a number of transparent words and including a transparent illustration or illustrations on the lith film 1, thereby providing the optical stencil 10.

Figure 3:
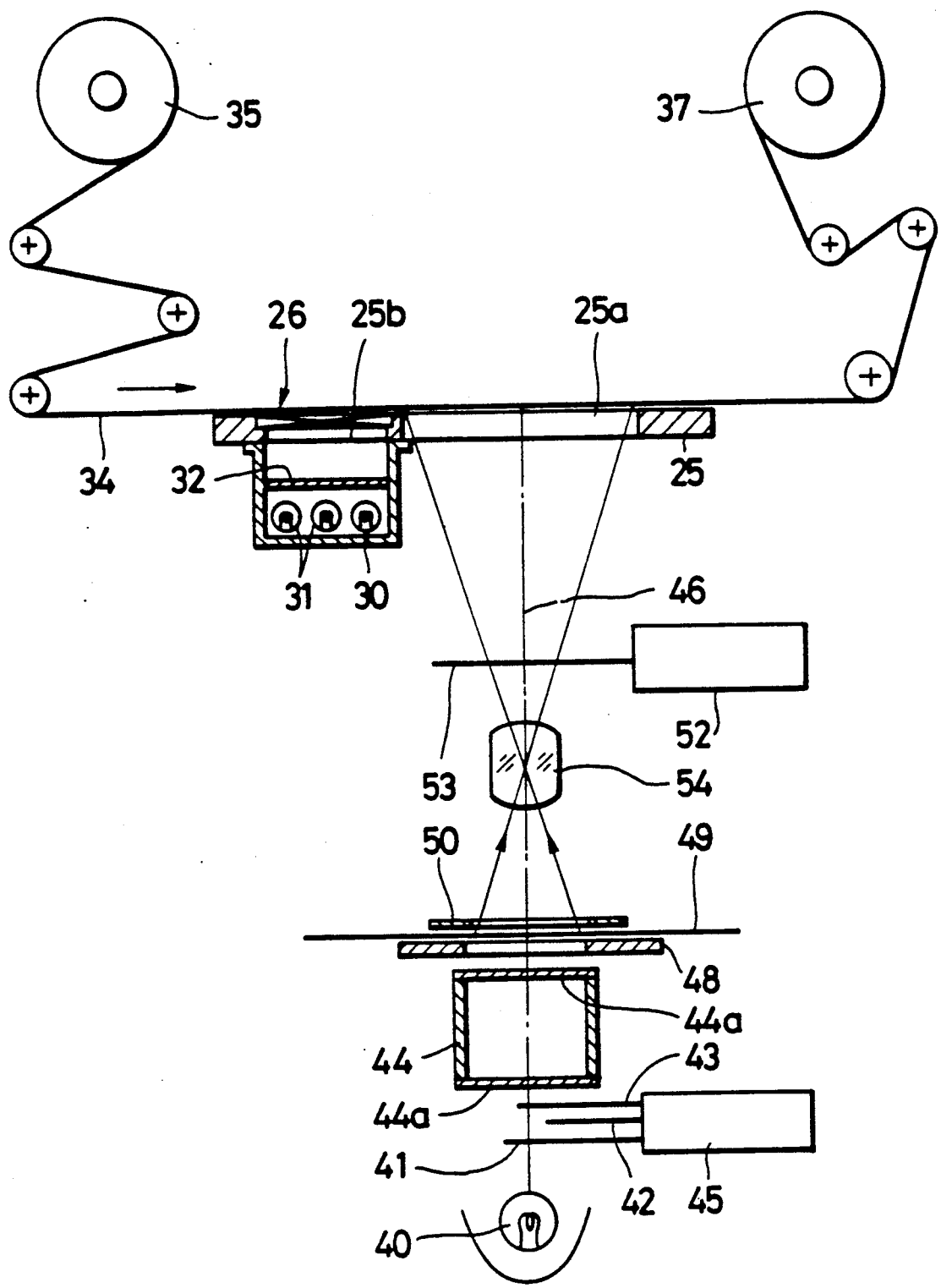
FIG. 3 is a schematic illustration showing a printer.
Figure 4:
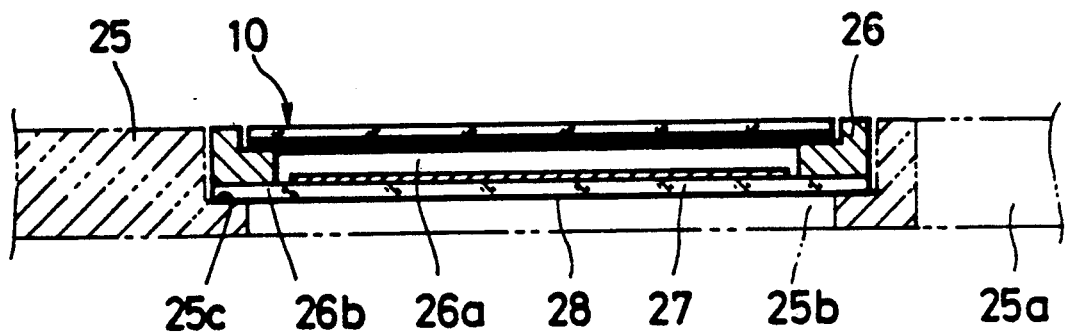
FIG. 4 is a cross-sectional view showing an optical stencil holder used printer shown in FIG. 3.

To make a photographic print with the compliment or message, a photographic printer shown in FIG. 3 is used. A paper masking frame 25 is formed with a subject image exposure opening 25a and an extra message print opening 25b. As shown in FIG. 4 in detail, the paper masking frame 25 is formed with a shoulder 25c surrounding the extra message print opening 25b for removably seating an optical stencil holder 26 holding the optical stencil 10.

The optical stencil holder 26 is formed with an opening 26a surrounded with a shoulder 26b and has a transparent cover plate 27, such as a transparent glass plate, attached to the under surface of the optical stencil holder 26. The optical stencil 10 is removably seated on the shoulder 26b with the transparent base sheet 2 facing up.

A lamp housing 30 containing three lamps 31 is attached to the paper masking frame 25 right below the word print opening 25b. These lamps 31 are controlled in a well known manner so as to emit white light for a predetermined period of time. The white light emitted from the lamps 31 is diffused by a diffusion plate 32 disposed in the lamp housing 30 above the lamps 31, and illuminates the optical stencil 10.

A color photographic paper 34, withdrawn from a reel 35 for exposure, is placed in an exposure station formed by the paper framing mask 25, and is wound around on a reel 37 after exposure.

Figure 5:
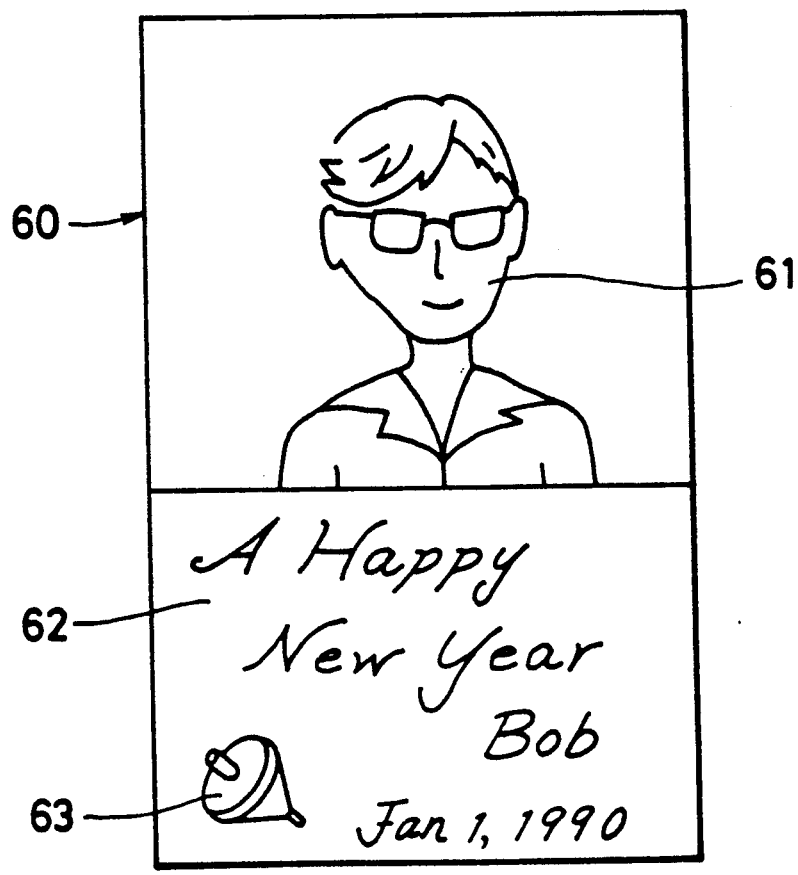
FIG. 5 is a plane view showing a post card.

The white light emitted from an illumination lamp 40 passing through cyan, magenta, and yellow filters 41, 42 and 43 controlled by a filter controller 45, is mixed in a mirror box 44 and diffused by diffusion plates 44a attached to the top and bottom openings of the mirror box 44. The diffused light passes through a color negative film 49 placed on an exposure aperture frame 48 and pressed down by an exposure masking frame 50 and is focused on the color photographic paper 34 by means of a printing lens 54 while a shutter 53 is opened by a shutter controller 52, thereby creating a latent image of the color negative film 49 in the color photographic paper 34. Simultaneously with, or before or after the printing of the color negative film 49, the lamps 31 in the lamp housing 30 are energized for a predetermined period of time, so as to project an image of the optical stencil 10 onto the color photographic paper 34, thereby creating a latent image of the transparent words of the optical stencil 10 in the color photographic paper 34. The exposed color photographic paper 34 then is developed in any well known manner, so that a print 60 with a subject image 61 and an extra message 62 including an illustration 63 shown in FIG. 5 is provided. Such a print is used as a post card or a greeting card.

The lith film 1 shown in FIG. 1, as was previously described, comprises the transparent base sheet 2, the thermoplastic interlayer 33 coated over the base sheet 2, and the thermoplastic ink-layer 4 coated over the transparent thermoplastic interlayer 3. The thermoplastic interlayer 3 is thin and transparent, and the thermoplastic ink-layer 4 is thin but opaque.

The transparent base sheet 2 is made of a plastic sheet, such as a polyethylene telephthalate sheet having a thickness of about 20μm to 150μm, and a relatively high firmness, so as to keep itself flat. The transparent base sheet 2 may be colored so as to print a color message on the print 60.

Examples of the transparent thermoplastic interlayer 3 and the light-opaque thermoplastic ink-layer 4 of the lith film 1 according to a preferred embodiment of the present invention are as follows:

EXAMPLE 1

| | Weight Percent |
|---|---|
| Thermoplastic Interlayer | |
| Melting Point: 68° C. | |
| Viscosity: 130 CPS at 98° C. | |

|                                      | Weight Percent |
| ------------------------------------ | -------------- |
| Carnauba Wax                         | 35             |
| Paraffin Wax                         | 55             |
| Ethylene Vinyl Acetate Copolymer     | 10             |
| Light-opaque Thermoplastic Ink-Layer |                |
| Petroleum Rosin                      | 18             |
| (Softening Point: 105° C.)           |                |
| Ethylene Vinyl Acetate Copolymer     | 20             |
| (Softening Point: 90° C.)            |                |
| Carnauba Wax                         | 22             |
| Polyethylene Wax                     | 15             |
| Carbon Black                         | 20             |
| Surface Active Agent                 | 5              |

Experiments have been made on a lith film in accordance with the above example to see how effective the thermoplastic interlayer is in fact. A lith film used as a test piece was structured by forming the thermoplastic interlayer 3μm thick over a polyestele base 100μm thick and the thermoplastic light-opaque ink-layer 5μm thick over the thermoplastic interlayer, in hot-melt coating. The test lith film was printed by a thermal ink-transfer printer with a 5μm thickness of polyestele peeling ribbon which both are commercially available. The result showed that the heated thermoplastic interlayer was completely peeled off by the peeling ribbon and the resulting negative lith film was formed with sharp transparent letters.

EXAMPLE 2

|                                  | Weight Percent |
| -------------------------------- | -------------- |
| Transparent Thermoplastic Interlayer |            |
| Melting Point: 80° C.            |                |
| Viscosity: 630 CPS at 110° C.    |                |
| Microcrystalline Wax             | 27             |
| Polyethylene Wax                 | 55             |
| Terpene Resin                    | 6              |
| Acrylic Resin                    | 10             |
| Mineral Oil                      | 2              |
| Thermoplastic Light Shielding Layer |             |
| Polyamide Resin                  | 55             |
| (Softening Point: 115° C.)       |                |
| Ester Wax                        | 17             |
| (Softening Point: 90° C.)        |                |
| Carbon Black                     | 25             |
| Surface Active Agent             | 3              |

Experiments have been made on a lith film in accordance with the above example to see how effective the thermoplastic interlayer is in fact. A lith film used as a test piece was structured by forming the thermoplastic interlayer 5μm thick over a polyestele base 75μm thick in hot-melt coating and the thermoplastic light-opaque ink-layer 4μm in dry thickness over the thermoplastic interlayer using with a solvent of isopropyl alcohol and toluene of 3 : 1 (volume) in Kiss Mayer coating. The test lith film was printed by a thermal ink-transfer printer with a 3.5 μm thickness of polycarbonate peeling ribbon having a rosin type thermoadhesive layer 1μm thick which both are commercially available. The result showed that the heated thermoplastic interlayer was completely peeled off by the peeling ribbon and the resulting negative lith film was formed with sharp transparent letters.

The lith film of the resent invention is an excellent material for negative lith films used to make the optical stencil 10 made by commercially available thermal ink-transfer printers.

Although the present invention has been fully described by way of the preferred embodiment thereof with reference to the accompanying drawings, various changes and modifications will be apparent to those skilled in the art. Unless these changes and modifications depart from the scope of the present invention, they should be construed as included therein.

What is claimed is:

1. A lithographic film material used to make an optical stencil by thermally removing an ink-layer of a lithographic film by means of an ink-transferred ribbon so as to form transparent words on the lithographic film, said lithographic film material comprising:

a transparent base sheet;

a transparent thermoplastic interlayer coated over said transparent base sheet through application of heat so as to be peelable from said transparent base sheet, sad transparent thermoplastic interlayer having a melting point between 55° C. and 140° C. and a viscosity lower than 2000cps measured at a temperature 30° C. higher than a temperature at which said transparent thermoplastic interlayer has melted; and a light-opaque thermoplastic ink-layer, having a thickness of between 0.5μm and 10μm and coated over said thermoplastic transparent interlayer, wherein said light-opaque thermoplastic ink-layer contains 5 to 90 weight percent of at least one kind of thermoplastic resin, each having a softening point between 50μ C. and 165° C.

2. A lithographic film material as defined in claim 1, wherein said transparent thermoplastic interlayer and said light-opaque thermoplastic ink-layer consists of the following components:

|                                      | (Weight Percent) |
| ------------------------------------ | ---------------- |
| Transparent Thermoplastic Interlayer |                  |
| Carnauba Wax                         | 35               |
| Paraffin Wax                         | 55               |
| Ethylene Vinyl Acetate Copolymer     | 10               |
| Light-Opaque Thermoplastic Ink-Layer |                  |
| Petroleum Rosin                      | 18               |
| (Softening Point: 105° C.)           |                  |
| Ethylene Vinyl Acetate Copolymer     | 20               |
| (Softening Point: 90° C.)            |                  |
| Carnauba Wax                         | 22               |
| Polyethylene Wax                     | 15               |
| Carbon Black                         | 20               |
| Surface Active Agent                 | 5                |

3. A lithographic film material as defined in claim 2, wherein said transparent thermoplastic interlayer has a melting point of 68° C. and a viscosity of 130cps at 98° C.

4. A lithographic film material as defined in claim 1, wherein said transparent thermoplastic interlayer and said light-opaque thermoplastic ink-layer consist of the following components:

|                                      | Weight Percent |
| ------------------------------------ | -------------- |
| Transparent Thermoplastic Interlayer |                |
| Microcrystalline Wax                 | 27             |
| Polyethylene Wax                     | 55             |
| Terpene Resin                        | 6              |
| Acrylic Resin                        | 10             |
| Mineral Oil                          | 2              |
| Light-opaque Thermoplastic Ink-Layer |                |
| Polyamide Resin                      | 55             |
| (Softening Point: 115° C.)           |                |

-continued

| | Weight Percent |
|---|---|
| Ester Wax | 17 |
| (Softening Point: 90° C.) | |
| Carbon Black | 25 |
| Surface Active Agent | 3 |

5. A lithographic film material as defined in claim 4, wherein said transparent thermoplastic interlayer has a melting point of 80° C. and a viscosity of 630cps at 110° C.

6. A lithographic film material as described in claim 1, wherein said melting point is between 75° C. and 120° C.

7. A lithographic film material as described in claim 1, wherein said viscosity is lower than 800cps when measured at a temperature 30° C. above a temperature at which said transparent thermoplastic interlayer has melted.

8. A lithographic film material as described in claim 1, wherein said thickness is between 3μm and 6μm.

* * * * *

UNITED STATES PATENT AND TRADEMARK OFFICE
CERTIFICATE OF CORRECTION

PATENT NO. : 5,028,475
DATED : July 2, 1991
INVENTOR(S) : Takehiko NISHIBUCHI

It is certified that error appears in the above-identified patent and that said Letters Patent is hereby corrected as shown below:

Title page:

Item [73], the Assignee should read --FUJI PHOTO FILM CO., LTD., Kanagawa, Japan & UNION CHEMICAR CO., LTD., Osaka, Japan--.

Signed and Sealed this

Twelfth Day of January, 1993

Attest:

DOUGLAS B. COMER

*Attesting Officer*     Acting Commissioner of Patents and Trademarks